United States Patent
Keng et al.

(10) Patent No.: US 9,831,250 B2
(45) Date of Patent: Nov. 28, 2017

(54) STATIC RANDOM ACCESS MEMORY

(71) Applicant: TAIWAN SEMICONDUCTOR MANUFACTURING CO., LTD., Hsinchu (TW)

(72) Inventors: Wen-Chun Keng, Hsinchu (TW); Feng-Ming Chang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/059,039

(22) Filed: Mar. 2, 2016

(65) Prior Publication Data
US 2017/0256549 A1    Sep. 7, 2017

(51) Int. Cl.
*H01L 27/11* (2006.01)
*H01L 29/78* (2006.01)

(52) U.S. Cl.
CPC ...... *H01L 27/1104* (2013.01); *H01L 29/7827* (2013.01)

(58) Field of Classification Search
CPC .................. H01L 27/1104; H01L 29/7827
See application file for complete search history.

(56) References Cited

U.S. PATENT DOCUMENTS

| | | | | |
|---|---|---|---|---|
| 7,138,685 B2 * | 11/2006 | Hsu | ................ | G11C 11/412 257/368 |
| 8,050,082 B2 * | 11/2011 | Lee | ................ | G11C 11/412 365/154 |
| 8,296,698 B2 * | 10/2012 | Wang | ................ | G06F 17/5045 716/100 |
| 8,519,483 B1 * | 8/2013 | Hart | ................ | H01L 27/0207 257/368 |
| 8,576,613 B2 * | 11/2013 | Kim | ................ | G11C 11/412 365/154 |
| 9,202,552 B2 * | 12/2015 | Paul | ................ | G11C 11/412 |
| 2015/0318288 A1 * | 11/2015 | Lim | ................ | H01L 27/1104 257/329 |
| 2015/0380548 A1 * | 12/2015 | Wang | ................ | H01L 29/66666 257/329 |
| 2016/0078922 A1 * | 3/2016 | Liaw | ................ | H01L 29/66666 365/51 |

* cited by examiner

*Primary Examiner* — William Coleman
(74) *Attorney, Agent, or Firm* — McDermott Will & Emery LPP

(57) ABSTRACT

A static random access memory (SRAM) cell includes first through fourth source diffusion regions sequentially arranged in a first direction, a first pass-gate transistor, a source region of which is formed by the first source diffusion region, first and second pull-up transistors, source regions of which are formed by the second source diffusion region, first and second pull-down transistors, source regions of which are formed by the third source diffusion region, a second pass-gate transistor, a source region of which is formed by the fourth source diffusion region, and an intermediate region between the first and second pass-gate transistors linearly extending along a direction parallel to the first direction and across the entire SRAM cell. Each of the first source diffusion region and the fourth source diffusion region is spaced-apart from the intermediate region.

20 Claims, 10 Drawing Sheets

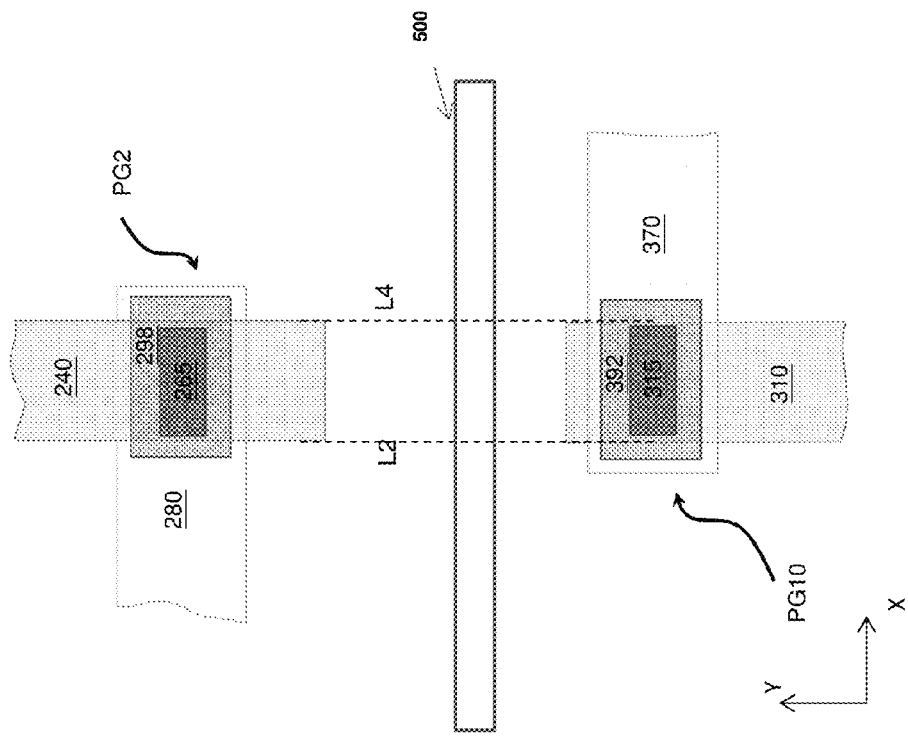
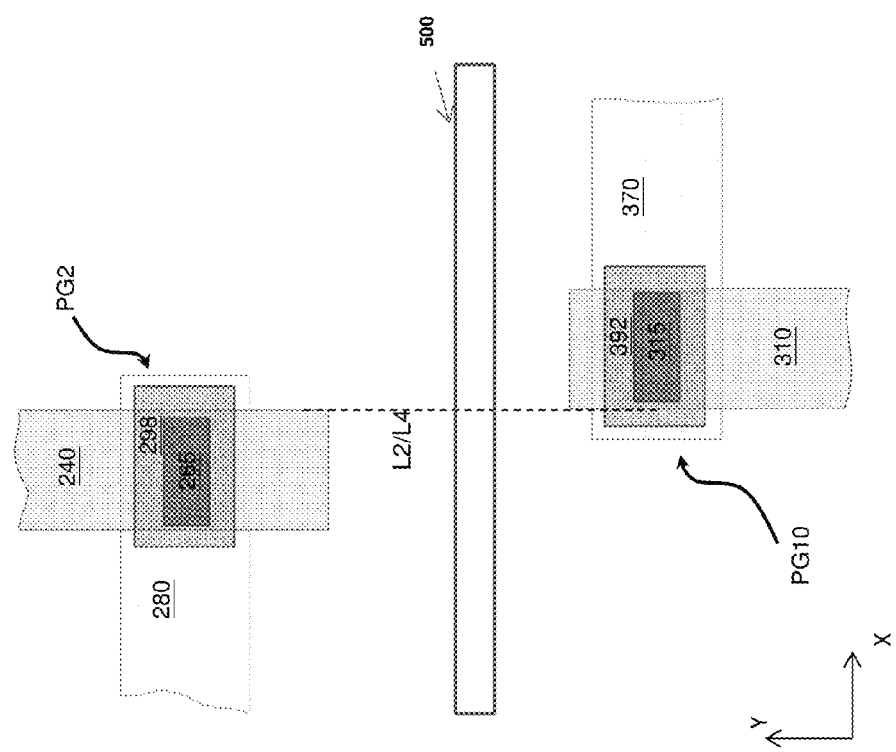

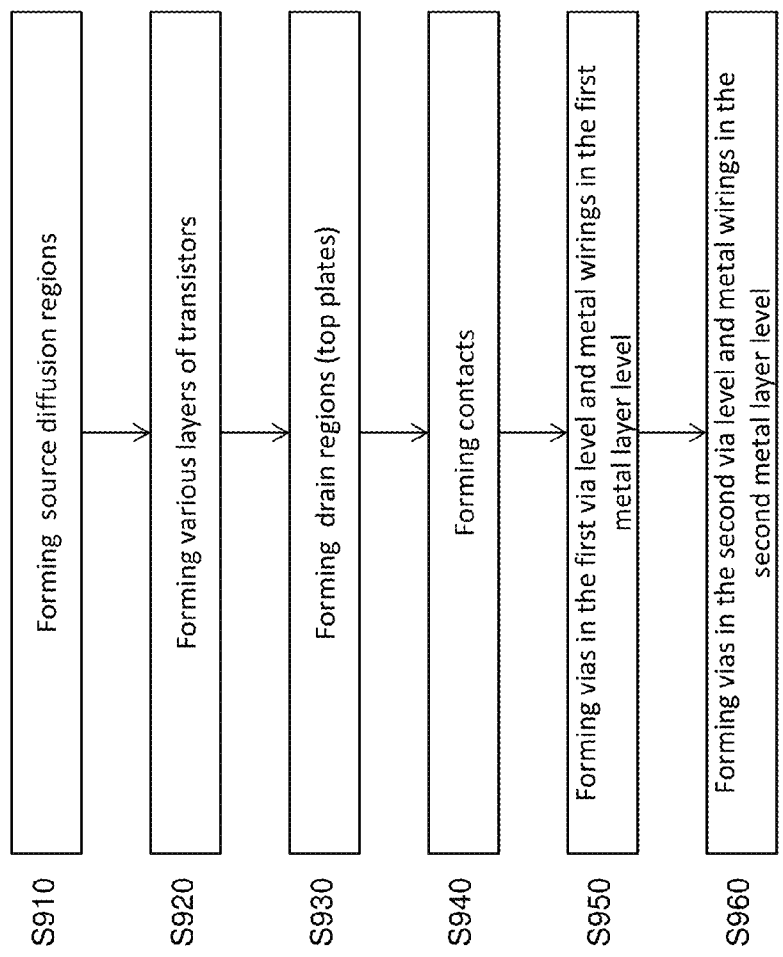

STATIC RANDOM ACCESS MEMORY

TECHNICAL FIELD

The present disclosure is generally related to a layout of a static random access memory (SRAM), and more particularly, to a layout of an SRAM having a reduced cell size.

BACKGROUND

A static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with vertical transistors having smaller size and lower power consumption. However, challenges have been emerged from integrating vertical transistors into a SRAM chip in the semiconductor industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A and 8B are simplified layouts of SRAM cells according to other embodiments of the present disclosure, based on modification of the layout of the SRAM cells illustrated in FIG. 6.

FIG. 9 shows a flowchart of a method for manufacturing an SRAM array according to an embodiment of the present disclosure.

DETAILED DESCRIPTION

Figure 1:
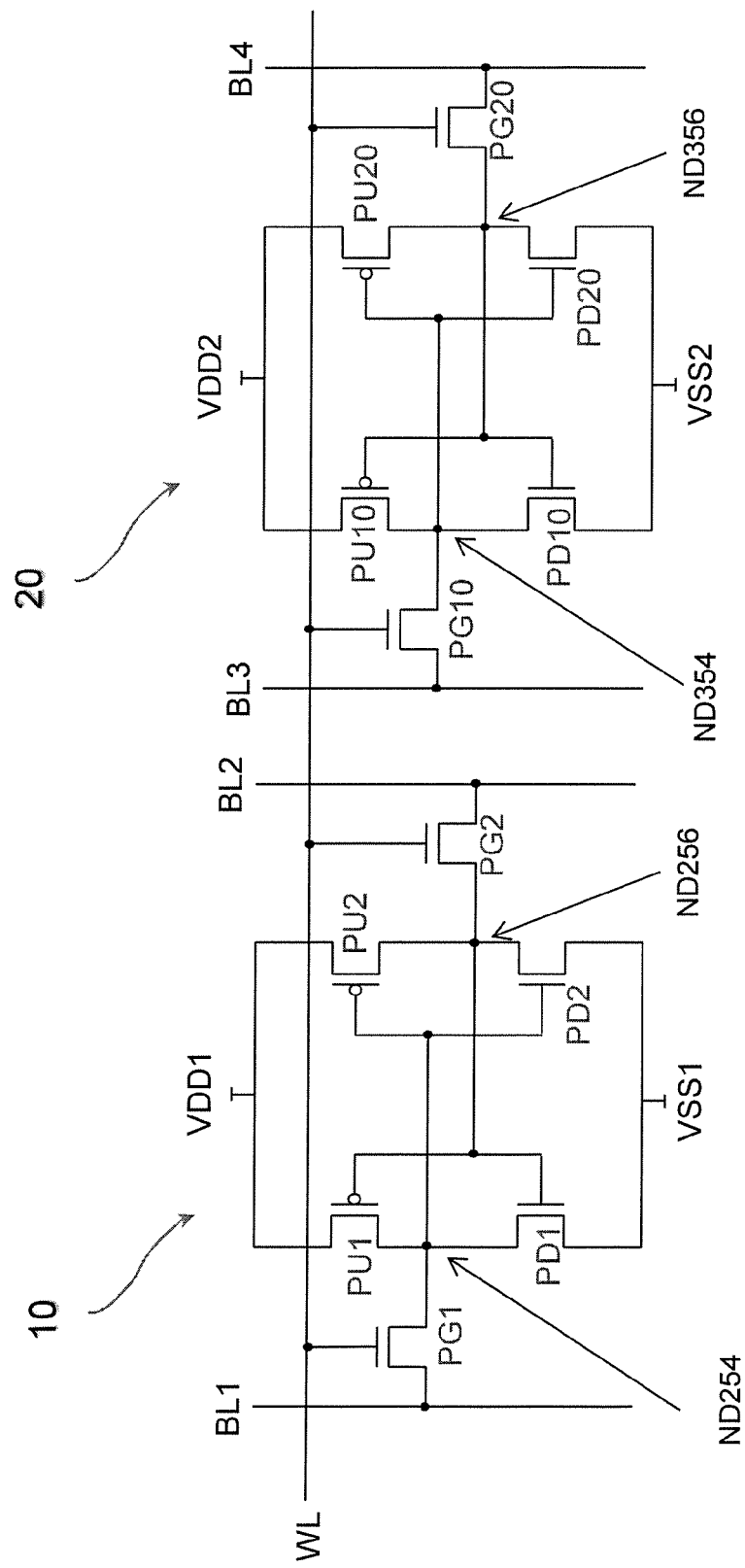
FIG. 1 is an exemplary circuit diagram of SRAM cells according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although in the present disclosure, circuit diagrams and layouts of two static random access memory (SRAM) cells are explained, it should be appreciated that an SRAM may include more than two SRAM cells arranged in an array. In such an SRAM, wordlines of the SRAM cells in the same row of the array may be connected to each other, bitlines of the SRAM cells in the same column of the array may be connected to each other, and power supply nodes of the SRAM cells in the same row or the same column may be connected to each other.

It should be appreciated that specifying source and drain regions, and source and drain electrodes of the same transistor in the present disclosure is merely to distinguish the source and drain regions from each other and the source and drain electrodes from each other. Source and drain regions of the same transistor can be referred to as drain and source regions, respectively, and source and drain electrodes of the same transistor can be referred to as drain and source electrodes, respectively. In other words, source and drain regions can be interchangeably used, and source and drain electrodes can also be interchangeably used in this disclosure.

In the present disclosure, when source (drain) regions of two or more transistors are formed by the same diffusion region and are connected to each other by the same diffusion region, the same diffusion region is referred to as a source (drain) diffusion region. When gate electrodes of two or more transistors are formed by the same gate layer and are connected to each other by the same gate layer, the same gate layer is referred to as a gate line.

In the present disclosure, a source diffusion region, of which a source region of a transistor is formed, refers to a diffusion region heavily doped with impurities formed in a top portion of a well in a substrate, and is surrounded by an insulating layer such as a shallow trench isolation (STI). The STI has a trench depth deeper than the source diffusion region but shallower than the well in which the source diffusion region is formed. Adjacent source diffusion regions are separated by the STI interposed therebetween.

FIG. 1 is an exemplary circuit diagram of SRAM cells according to various embodiments of the present disclosure.

First and second SRAM cells 10 and 20 are illustrated in the exemplary circuit diagram of FIG. 1. According to some embodiments, the first and second SRAM cells 10 and 20 are identical to each other and disposed immediately adjacent to each other in the same row of an SRAM.

As shown in FIG. 1, the first SRAM cell 10 includes a first pull-up transistor PU1, a first pull-down transistor PD1, and a first pass-gate transistor PG1. Drain electrodes of the first pull-up transistor PU1, the first pull-down transistor PD1, and the first pass-gate transistor PG1 are electrically connected at a first data storage node ND254. The first SRAM cell 10 further includes a second pull-up transistor PU2, a second pull-down transistor PD2, and a second pass-gate transistor PG2. Drain electrodes of the second pull-up transistor PU2, the second pull-down transistor PD2, and the second pass-gate transistor PG2 are electrically connected at a second data storage node ND256.

In some embodiments, gate electrodes of the second pull-up transistor PU2 and the second pull-down transistor PD2 are electrically connected to the drain electrodes of the first pull-down transistor PD1, the first pass-gate transistor PG1, and the first pull-up transistor PU1 through the first data storage node ND254. Gate electrodes of the first pull-up transistor PU1 and the first pull-down transistor PD1 are electrically connected to the drain electrodes of the second pull-down transistor PD2, the second pass-gate transistor PG2, and the second pull-up transistor PU2 through the second data storage node ND256.

In some embodiments, source electrodes of the first and second pull-up transistors PU1 and PU2 are connected to a first power supply node VDD1, while source electrodes of the first and second pull-down transistors PD1 and PD2 are connected to a second power supply node VSS1. According to one embodiment, the first power supply node VDD1 is electrically connected to a positive voltage potential, supplied by a power supply circuit (not shown) of the SRAM, and the second power supply node VSS1 is electrically connected to a ground.

Gate electrodes of the first and second pass-gate transistors PG1 and PG2 are connected to a wordline WL. Source electrodes of the first and second pass-gate transistors PG1 and PG2 are connected to first and second bitlines BL1 and BL2, respectively.

During a reading operation of the first SRAM cell 10, when the first and second pass-gate transistors PG1 and PG2 are turned on, for example, by a reading signal applied to the gate electrodes of the first and second pass-gate transistors PG1 and PG2 via the wordline WL, complementary data stored in the first and second data storage nodes ND254 and ND256 are transmitted, via the first and second pass-gate transistors PG1 and PG2, to the first and second bitlines BL1 and BL2 which are connected to a sense amplifier (not shown) of the SRAM, respectively. During a writing operation of the first SRAM cell 10, when the first and second pass-gate transistors PG1 and PG2 are turned on, for example, by a writing signal applied to the gate electrodes of the first and second pass-gate transistors PG1 and PG2 via the wordline WL, complementary data pre-applied to the first and second data lines BL1 and BL2 are transmitted to the first and second data storage nodes ND254 and ND256 via the first and second pass-gates PG1 and PG2 and stored at the first and second data storage nodes ND254 and ND256, respectively.

Referring to FIG. 1, the second SRAM cell 20 includes a first pull-up transistor PU10, a first pull-down transistor PD10, and a first pass-gate transistor PG10. Drain electrodes of the first pull-up transistor PU10, the first pull-down transistor PD10, and the first pass-gate transistor PG10 are electrically connected at a first data storage node ND354. The first SRAM cell 10 further includes a second pull-up transistor PU20, a second pull-down transistor PD20, and a second pass-gate transistor PG20. Drain electrodes of the second pull-up transistor PU20, the second pull-down transistor PD20, and the second pass-gate transistor PG20 are electrically connected at a second data storage node ND356.

Source electrodes of the first and second pull-up transistors PU10 and PU20 are connected to a third power supply node VDD2 which can be connected to the same voltage potential as the first power supply node VDD1, while source electrodes of the first and second pull-down transistors PU10 and PU20 are connected to a fourth power supply node VSS2 which can be connected to the same voltage potential as the second power supply node VSS1.

Gate electrodes of the first and second pass-gate transistors PG10 and PG20 of the SRAM cell 20 are connected to the wordline WL. Source electrodes of the first and second pass-gate transistors PG10 and PG20 are connected to third and fourth bitlines BL3 and BL4, respectively.

A description of other features of the second SRAM cell 20 overlapping those of the first SRAM cell 10 described above will be omitted in order to avoid redundancy.

Figure 2:
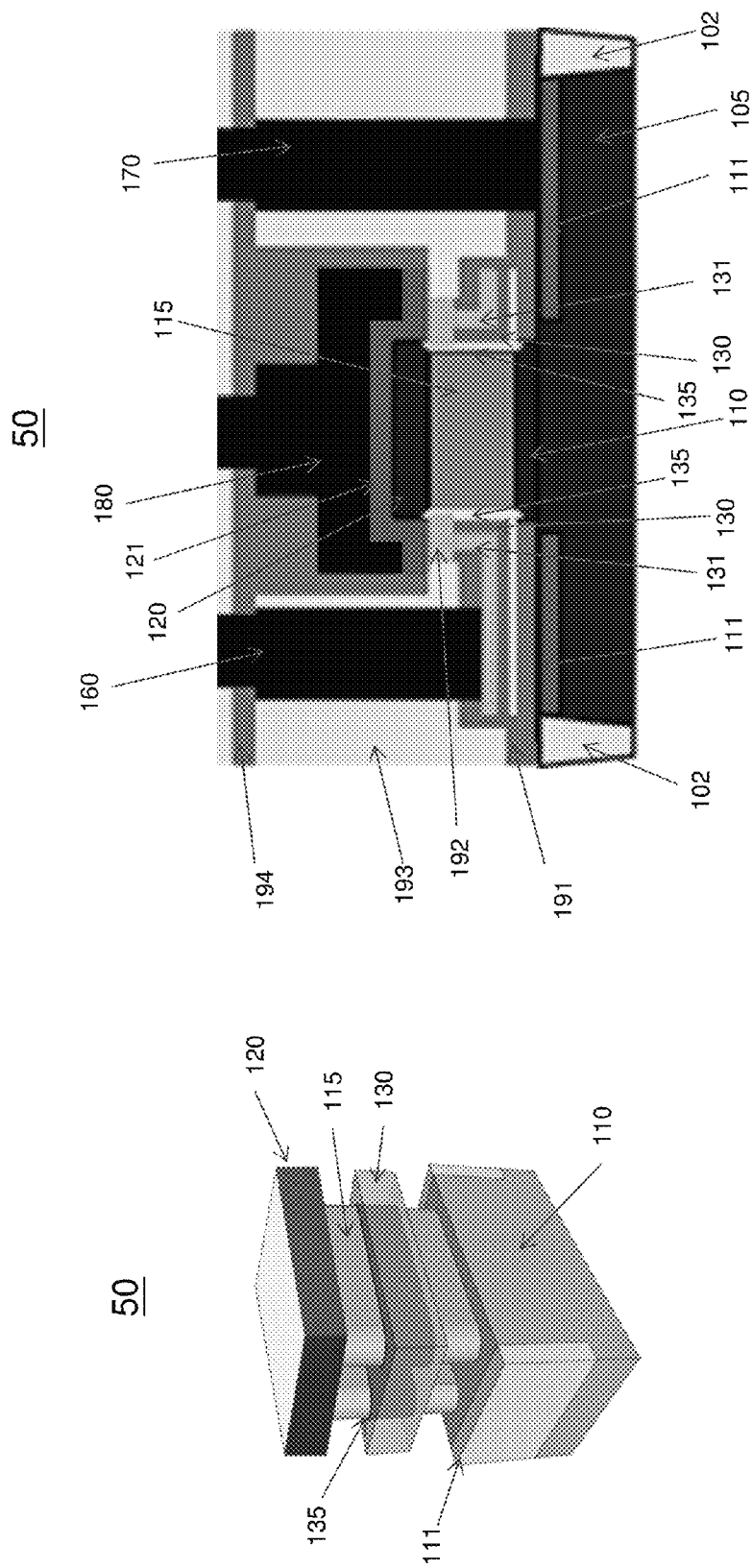
FIG. 2A is a schematically perspective view of key elements of an exemplary vertical transistor according to some embodiments of the present disclosure.
FIG. 2B is a schematically cross-sectional view of the exemplary vertical transistor.

FIG. 2A is a schematically perspective view of some elements of an exemplary vertical transistor according to some embodiments of the present disclosure, and FIG. 2B is a schematically cross-sectional view of the exemplary vertical transistor. The exemplary vertical transistor, configured as either an N-type transistor or a P-type transistor, may be employed in the first and second SRAM cells 10 and 20 illustrated in FIG. 1.

Referring to FIGS. 2A and 2B, an exemplary vertical transistor 50 includes source and drain regions 110 and 120 and a channel 115 interposed therebetween. The source region 110, the channel 115, and the drain region 120 may be vertically formed over a substrate (not shown) by stacking the source region 110, the channel 115, and the drain region 120 on one another in a direction perpendicular to a major surface of the substrate. The exemplary vertical transistor 50 further includes a gate electrode 130 surrounding the channel 115 and a gate insulating layer 135 interposed between the gate electrode 130 and the channel 115 so as to electrically isolate the channel 115 from the gate electrode 130. Since the gate electrode 130 surrounds the channel 115, the exemplary vertical transistor 50 can be called as a vertical gate all-around (VGAA) transistor. According to various embodiments of the present disclosure, the exemplary vertical transistor 50 may be either an N-type transistor or a P-type transistor. However, for the convenience of explanation, the exemplary vertical transistor 50 is configured to be an N-type transistor as an example in the following description.

The exemplary vertical transistor 50 may be formed in an N+ ("+" refers to being heavily doped) source diffusion region 105 with heavily doped N-type impurities, such as P, As, Sb, N, or combinations thereof. The source diffusion region 105 may be defined by shallow trench isolation (STI) 102 made of an insulating material. By forming the STI 102, electric current leakage between the exemplary vertical transistor 50 and other semiconductor devices formed in source diffusion regions adjacent to the source diffusion region 105 may be minimized or prevented. According to other embodiments, the N+ source diffusion region 105 may be formed of an epitaxy layer epitaxially grown on the substrate.

A portion of the N+ source diffusion region 105 acts as the source region 110 of the exemplary vertical transistor 50. Although not illustrated in FIGS. 2A and 2B, according to one embodiment of the present disclosure, additional vertical transistors having the same conductivity type as the exemplary vertical transistor 50 may be formed in the same N+ source diffusion region 105, and thus, source regions of all the vertical transistors formed in the same N+ source diffusion region 105 are directly electrically connected to each other. Such features will become more apparent with reference to FIG. 3 to be introduced later.

According to some embodiments, the channel 115 of the exemplary vertical transistor 50 is a single nanowire, multiple nanowires, or a nano-bar type having a rectangular or oval shape viewed in the direction perpendicular to the major surface of the substrate. The channel 115 may include a semiconductor material, which may be formed by epitaxy, such as silicon, germanium, SiGe, SiC, SP, SiPC, a Group III-V compound semiconductor, or the like. For example, the Group III-V compound semiconductor may include InP, InAs, GaAs, AlInAs, InGaP, InGaAs, GaAsSb, GaPN, AlPN, or combinations thereof. The channel 115 may include, if necessary, lightly doped P-type impurities so as to form a P-type semiconductor. The gate electrode 130, which may be formed of polysilicon or another conductive material such as a metal, a metal alloy, a metal silicide, etc., surrounds the channel 115. The gate insulating layer 135, interposed between the gate electrode 130 and the channel 115 so as to electrically isolate the channel 115 from the gate electrode 130, may include one or more high-k dielectric layers, such as metal oxides. Examples of metal oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

The drain region 120 of the exemplary vertical transistor 50 is formed of an N+ semiconductor layer including heavily doped N-type impurities, such as P, As, Sb, N, or combinations thereof. The exemplary transistor 50 further includes a conductive layer 121 formed of polysilicon, silicide, a metal, a metal alloy, or the like over the drain region 120. The drain region 120 and the conductive layer 121 are in combination referred to as a top plate of the exemplary transistor 50. If necessary, a contact via 180 may be formed over the top plate to electrically connect the top plate and a metal layer (not shown in FIGS. 2A and 2B) formed on a surface of the exemplary transistor 50 to each other.

The exemplary transistor 50 further includes a silicide region 111 over the N+ source diffusion region 105. In some embodiments, the silicide layer 111 is formed on and conterminous to the source diffusion region 105, except that a portion of the silicide layer 111 is removed so as to form the vertical transistor 50. The combination of the source diffusion region 105 and the silicide region 111 is referred to as a bottom plate. According to other embodiments, a germanide layer, instead of silicide layer, is alternatively formed on a source diffusion region to implement a bottom plate including the source diffusion region and the germanide layer. Another contact via 170 may be formed over the bottom plate to electrically connect the bottom plate to a metal layer (not shown in FIGS. 2A and 2B), such as a power supply node or a bitline, formed over the exemplary transistor 50.

The exemplary transistor 50 further includes a local connection layer 131 over the gate electrode 130. In some embodiments, the gate electrode 130 of the exemplary vertical transistor 50 can be electrically connected to drain regions of other vertical transistors through the local connection layer 131. Such features will be more apparent with reference to first and second data storage electrodes 254 and 256 and first and second local connection lines 252 and 258 illustrated in FIGS. 3 and 5. The local connection layer 131 may be formed of polysilicon or another conductive material such as a metal, a metal alloy, a metal silicide, or the like. In other embodiments, the gate electrode 130 may be connected to a metal layer, such as a wordline, formed on the surface of the exemplary transistor 50 through a contact via 160 and/or the local connection layer 131.

As shown in FIG. 2B, the exemplary vertical transistor 50 can include one or more dielectric layers, such as dielectric layers 191 through 194. Such dielectric layers may insolate various conductive or semiconductor layers from each other and may include a plurality of through holes, in which the contact vias 160, 170, and 180 are formed. It should be appreciated that the dielectric layers 191 through 194 are merely for the purpose of illustration and the exemplary vertical transistor 50 according to embodiments of the present disclosure may have fewer or more than four dielectric layers.

It should be appreciated that one skilled in the art will realize that a P-type vertical transistor may be manufactured, for example, by using different types of dopants from those mentioned above to form the N-type exemplary vertical transistor 50.

According to some embodiments, the aforementioned vertical transistors, either N-type or P-type, are implemented in the SRAM cells as illustrated in FIG. 1. Such features will become more apparent with reference to FIG. 3.

Figure 3:
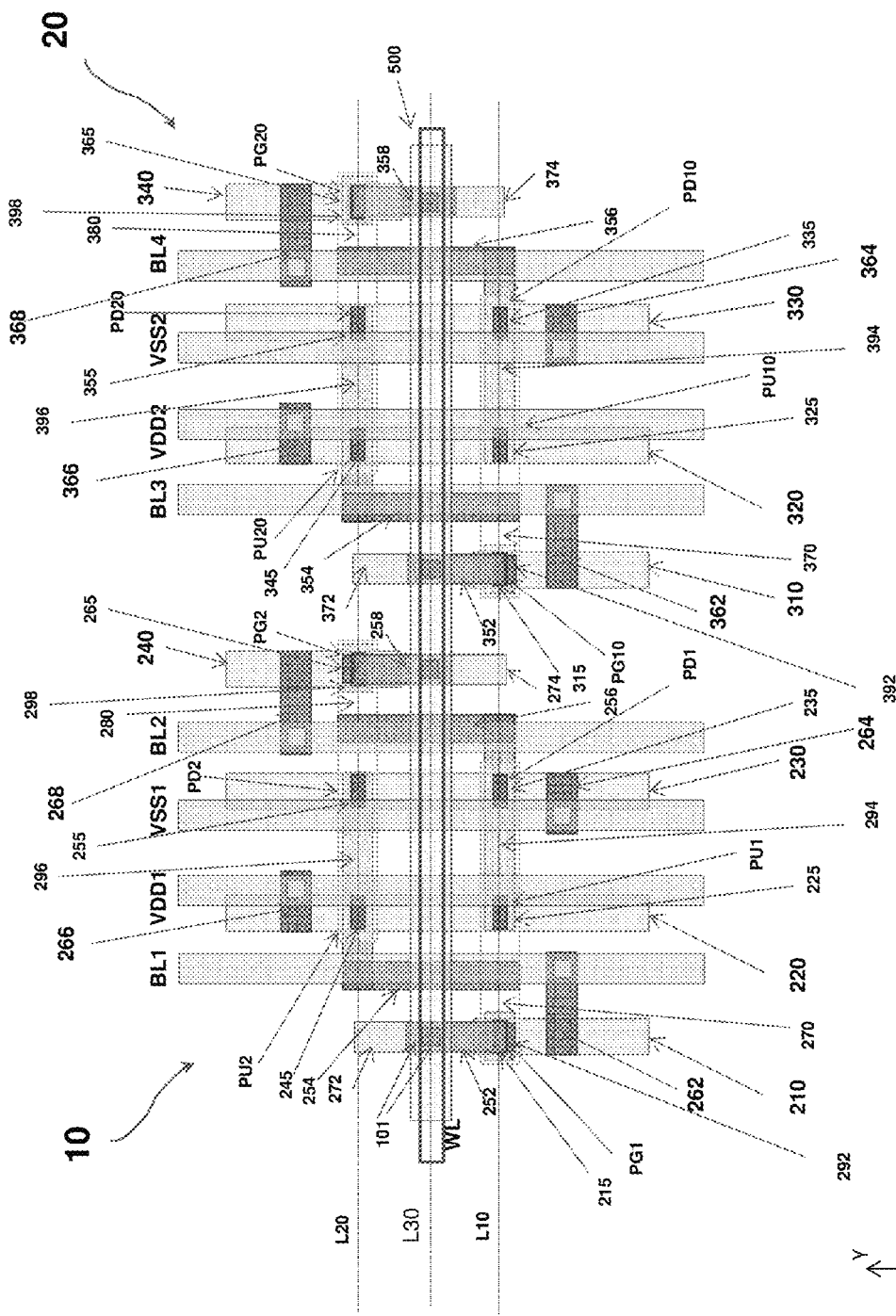
FIG. 3 is a layout of SRAM cells according to some embodiments of the present disclosure.
Figure 4:
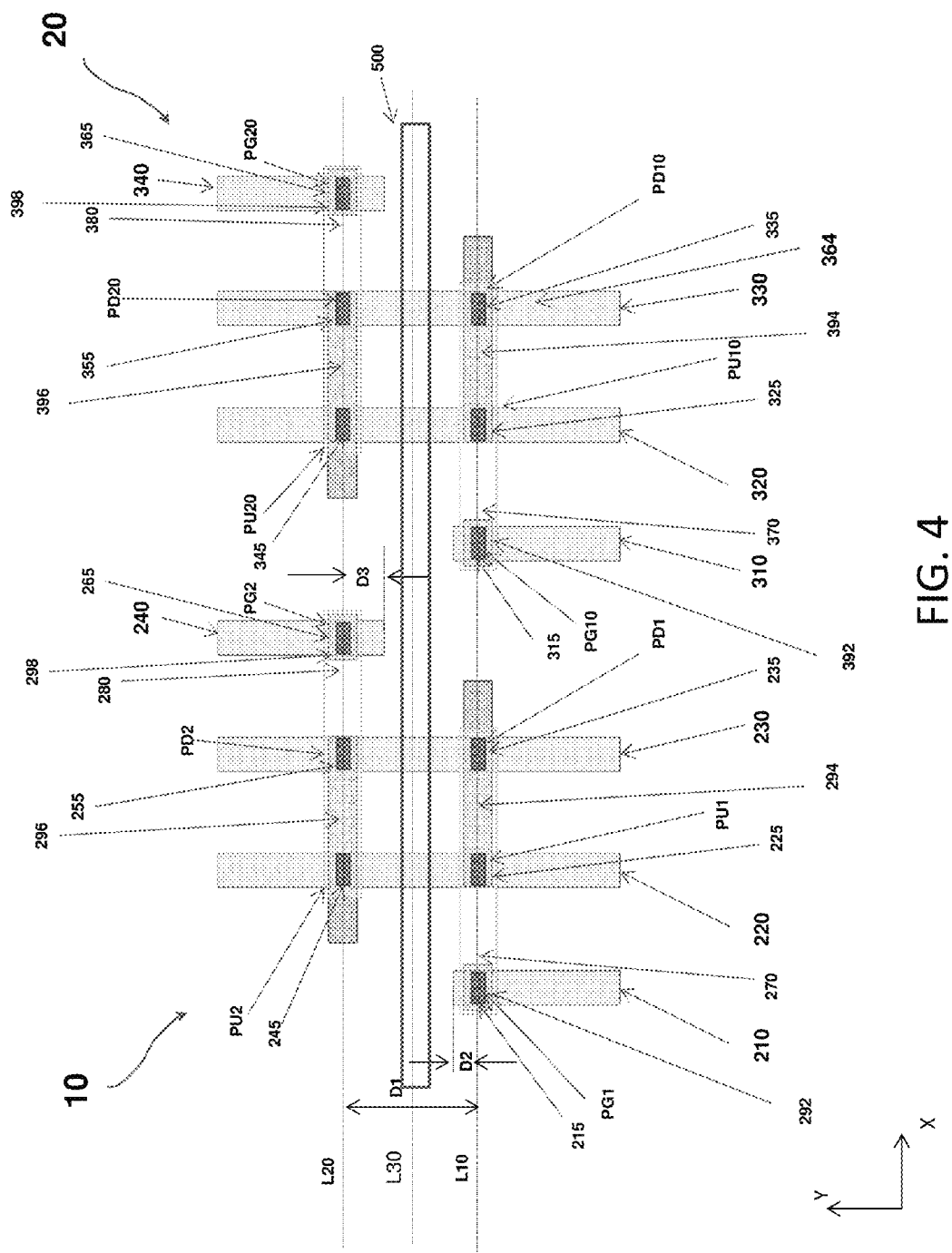
FIG. 4 is the layout of the SRAM cells illustrated in FIG. 3, in which only channel, source diffusion regions, gate lines, and drain diffusion regions are illustrated.
Figure 5:
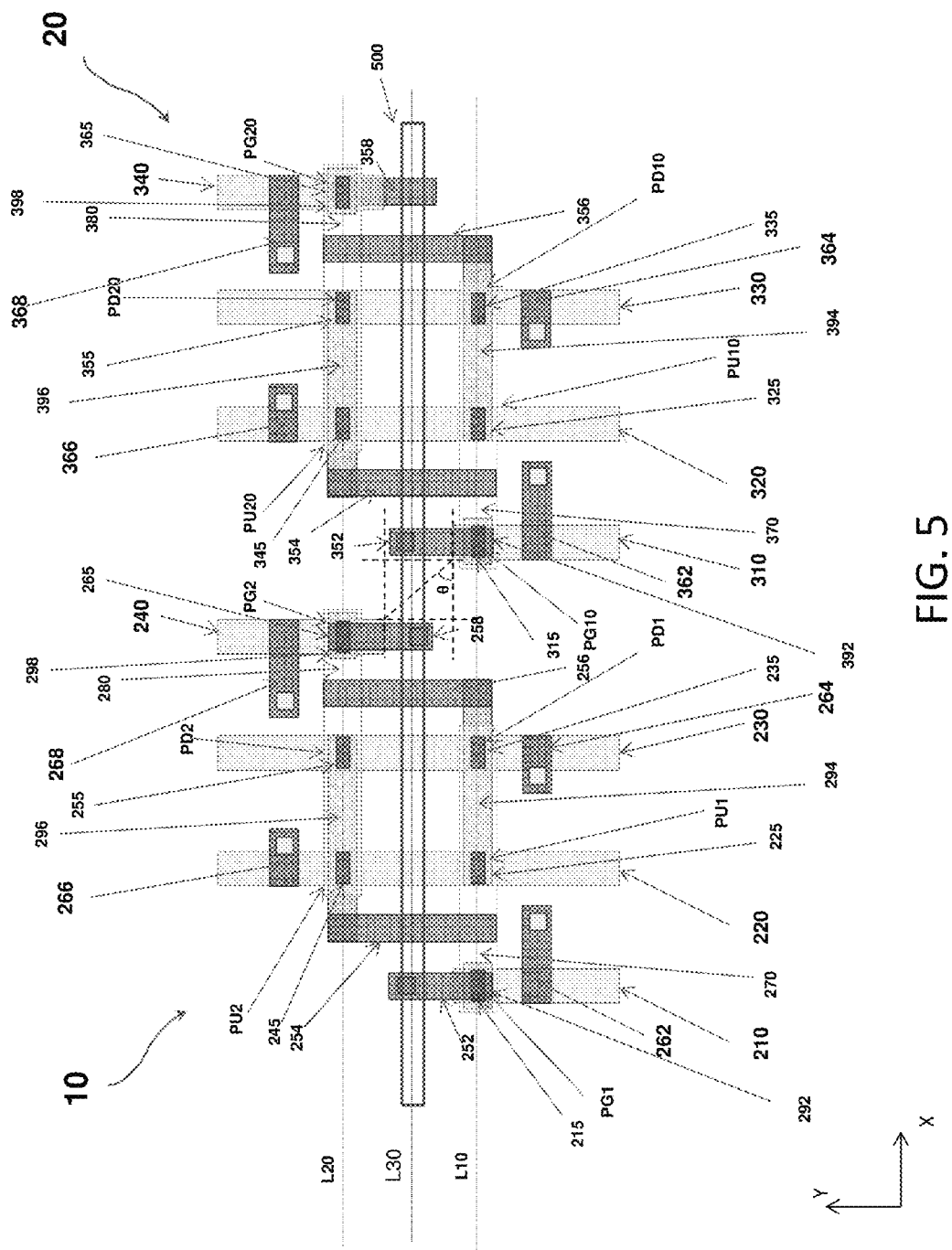
FIG. 5 is the layout of the SRAM cells illustrated in FIG. 3, in which only channel, source diffusion regions, gate lines, drain diffusion regions, and interconnection regions are illustrated.
Figure 6:
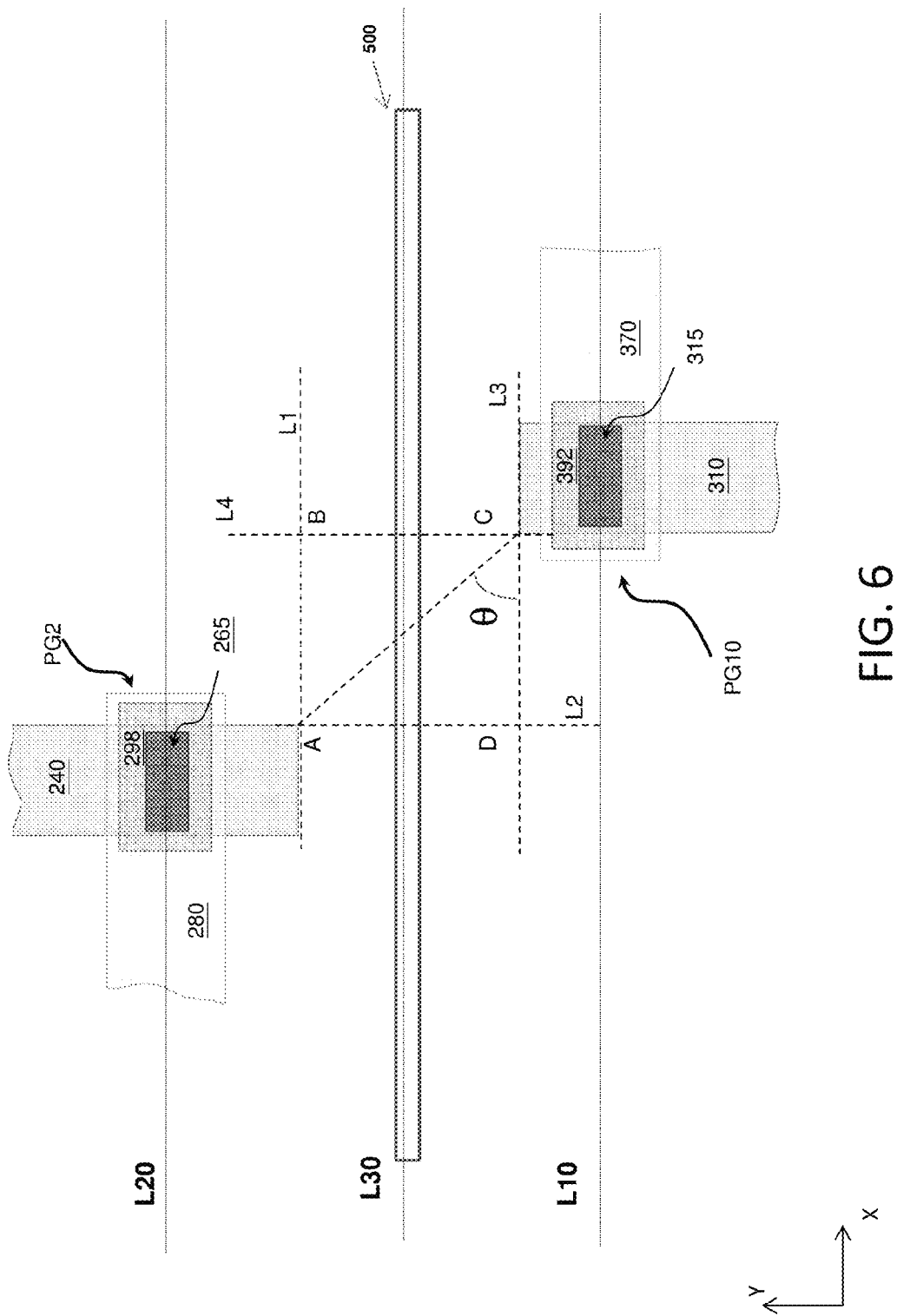
FIG. 6 is an enlarged view schematically illustrating key components of adjacent pass-gate transistors of the SRAM cells of FIG. 3.

FIG. 3 is a layout of SRAM cells according to some embodiments of the present disclosure. FIG. 4 is the layout of the SRAM cells illustrated in FIG. 3, in which only channel, source diffusion regions, gate lines, and drain diffusion regions are illustrated. FIG. 5 is the layout of the SRAM cells illustrated in FIG. 3, in which only channel, source diffusion regions, gate lines, drain diffusion regions, and interconnection regions are illustrated. FIG. 6 is an enlarged view schematically illustrating some components of adjacent pass-gate transistors of the SRAM cells of FIG. 3.

Referring to FIGS. 3 through 5, a static random access memory (SRAM) may include first and second SRAM cells 10 and 20 arranged in the same row in a first direction (X axis). The first SRAM cell 10 includes a first pass-gate transistor PG1, a source region of which is formed by a first source diffusion region 210, first and second pull-up transistors PU1 and PU2, source regions of which are formed by a second source diffusion region 220, first and second pull-down transistors PD1 and PD2, source regions of which are formed by a third source diffusion region 230, and a second pass-gate transistor PG2, a source region of which is formed by a fourth source diffusion region 240. The first through fourth source diffusion regions 210, 220, 230, and 240 are sequentially arranged and spaced-apart from each other in the first direction (X axis).

In the first SRAM cell 10, the first and second pass-gate transistors PG1 and PG2 are arranged at opposite sides in the first direction (X axis), respectively. The first and second pull-up transistors PU1 and PU2 and the first and second pull-down transistors PD1 and PD2, acting as data storage transistors, are arranged between the opposite sides of the first SRAM cell 10.

Channels 215, 225, and 235 of the first pass-gate transistor PG1, the first pull-up transistor PU1, and the first pull-down transistor PD1 are disposed in a first path L10 parallel to the first direction (X axis), while channels 245, 255, and 265 of the second pull-up transistor PU2, and the second pull-down transistor PD2, the second pass-gate transistor PG2 are disposed in a second path L20 parallel to the first direction (X axis). The first and second paths L10 and L20 are spaced-apart from each other by a distance D1 in a second direction (Y axis) perpendicular to the first direction (X axis), as shown in FIG. 4.

Referring to FIG. 4, the second and third source diffusion regions 220 and 230 extend continuously between the first and second paths L10 and L20, and the first and fourth source diffusion regions 210 and 240 extend discontinuously between the first and second paths L10 and L20. According to some embodiments, the first source diffusion region 210 covers a region at the first path L10 and is spaced-apart from a central path L30 between the first and second paths L10 and L20, and the fourth source diffusion region 240 covers a region at the second path L20 and is spaced-apart from the central path L30. For example, a length D2 of a portion of the first source diffusion region 210 between the first and second paths L10 and L20 is less than half of the distance D1 and a length D3 of a portion of the fourth source diffusion region 240 between the first and second paths L10 and L20 is less than half of the distance D1.

As shown in FIGS. 3 through 5, drain regions of the first pass-gate transistor PG1, the first pull-up transistor PU1, and the first pull-down transistor PD1 are electrically connected to each other through a first drain diffusion region 270 extending along the first direction (X axis), and drain regions of the second pass-gate transistor PG2, the second pull-up transistor PU2, and the second pull-down transistor PD2 are electrically connected to each other through a second drain diffusion region 280 extending along the first direction (X axis).

Gate electrodes of the first pull-up transistor PU1 and the first pull-down transistor PD1 are electrically connected to each other through a first gate line 294 extending along the first direction (X axis). Gate electrodes of the second pull-up transistor PU2 and the second pull-down transistor PD2 are electrically connected to each other through a second gate line 296 extending along the first direction (X axis). According to some embodiments, the first drain diffusion region 270 and the second gate line 296 are electrically connected to each other through a first data storage electrode 254, and the second drain diffusion region 280 and the first gate line 294 are electrically connected to each other through a second data storage electrode 256. Gate electrodes 292 and 298 of the first and second pass-gate transistors are electrically connected, for example, through first and second local connection lines 252 and 258, respectively, to a wordline WL extending along the first direction (X axis). As shown in FIG. 5, the first and second data storage electrodes 254 and 256, similar to the first and second local connection lines 252 and 258, are local connection lines of the first SRAM cell 10. A configuration of the first and second data storage electrodes 254 and 256 and the first and second local connection lines 252 and 258 may refer to the aforementioned local connection layer 131 with reference to FIG. 2B, and therefore, a description thereof will be omitted here in order to avoid redundancy.

The first source diffusion region 210 by which a source region of the first pass-gate transistor PG1 is formed is electrically connected to a first bitline, the second source diffusion region 220 by which source regions of the first and second pull-up transistors PU1 and PU2 are formed is electrically connected to a first power supply node VDD1, the third source diffusion region 230 by which source regions of the first and second pull-down transistors PD1 and PD2 are formed is electrically connected to a second power supply node VSS1, and the fourth source diffusion region 240 by which a source region of the second pass-gate transistor PG2 is formed is electrically connected to a second bitline BL2. It should be appreciated that the first and second bitlines BL1 and BL2 and the first and second power supply nodes VDD1 and VSS1 may extend along the second direction (Y axis) and formed of a different metal layer from the wordline WL.

To improve electrical conductivity and a ratio of signal-to-noise between the wordline WL and the gate electrodes 292 and 298 of the first and second pass-gate electrodes PG1 and PG2, according to some embodiments, metal wirings 272 and 274, which may be formed of the same layer as the first and second bitlines BL1 and BL2 and the first and second power supply nodes VDD1 and VSS1, are disposed over the first and second local connection lines 252 and 258, respectively. As shown in FIG. 3, the wordline WL, the metal wirings 272 and 274, the first and second local connection lines 252 and 258 may be connected to each other through contact vias 101.

Referring to FIG. 3, according to some embodiments, the first SRAM cell 10 further includes first through fourth conductive wirings 262, 266, 264, and 268 which may be formed of metal over the first through four source diffusion regions 210, 220, 230, and 240, respectively, to electrically connect the first through fourth regions 210, 220, 230, and 240 to the first bitline BL1, the first power supply node VDD1, the second power supply VSS1, and the second bitline BL2, respectively.

Referring to FIGS. 3 through 5, the second SRAM cell 20, which may be identical to the first SRAM cell 10, includes a first pass-gate transistor PG10, a source region of which is formed by a first source diffusion region 310, first and second pull-up transistors PU10 and PU20, source regions of which are formed by a second source diffusion region 320, first and second pull-down transistors PD10 and PD20, source regions of which are formed by a third source diffusion region 330, and a second pass-gate transistor PG20, a source region of which is formed by a fourth source diffusion region 340. The first through fourth source diffusion regions 310, 320, 330, and 340 are sequentially arranged and spaced-apart from each other in the first direction (X axis).

In the second SRAM cell 20, channels 315, 325, and 335 of the first pass-gate transistor PG10, the first pull-up transistor PU10, and the first pull-down transistor PD10 are disposed in the first path L10, while channels 345, 355, and 365 of the second pull-up transistor PU20, and the second pull-down transistor PD20, the second pass-gate transistor PG20 are disposed in the second path L20.

Similar to the first SRAM cell 10, in the SRAM cell 20, the second and third source diffusion regions 320 and 330 extend continuously between the first and second paths L10 and L20, and the first and fourth source diffusion regions 310 and 340 extend discontinuously between the first and second paths L10 and L20. According to some embodiments, in the SRAM cell 20, the first source diffusion region 310 covers a region at the first path L10 and is spaced-apart from the second path L20, and the fourth source diffusion region 340 covers a region at the second path L20 and is spaced-apart from the first path L10.

The SRAM cells 10 and 20 have an intermediate region 500 between the first and second paths L10 and L20. The intermediate region 500 is a region which intersects the entire SRAM cells 10 and 20 in a direction perpendicular to the first direction (X axis) and the second direction (Y axis) and which linearly extends in a direction parallel to the first direction (X axis). Each of the first and fourth source diffusion regions 210 and 240 of the first SRAM cell 10 and the first and fourth source diffusion regions 310 and 340 of the second SRAM cell 20 is spaced-apart from the intermediate region 500.

It should be appreciated that, the elements denoted by reference numerals 370 and 380 of the second SRAM cell 20 correspond to the elements 270 and 280 of the first SRAM cell 10, respectively, the elements denoted by reference numerals 392, 394, 396, and 398 of the second SRAM cell 20 correspond to the elements 292, 294, 296, and 298 of the first SRAM cell 10, respectively, the elements denoted by reference numerals 352, 354, 356, and 358 of the second SRAM cell 20 correspond to the elements 252, 254, 256, and 258 of the first SRAM cell 10, respectively, the elements denoted by reference numerals BL3, VDD2, VSS2, BL4 of the second SRAM cell 20 correspond to the elements BL1, VDD1, VSS1, BL2, respectively, and the elements denoted by reference numerals 362, 364, 366, and 368 of the second SRAM cell 20 correspond to the elements 262, 264, 266, and 268, respectively. To avoid redundancy, a description thereof will be omitted in the present discourse.

Referring still to FIGS. 3 through 5, the second pass-gate transistor PG2 of the first SRAM cell 10 and the first pass-gate transistor PG10 of the second SRAM cell 20 are disposed between the data storage transistors, such as the first and second pull-up transistors PU1 and PU2 and the first and second pull-down transistors PD1 and PD2, of the first SRAM cell 10 and the data storage transistors, such as the first and second pull-up transistors PU10 and PU20 and the first and second pull-down transistors PD10 and PD20, of the second SRAM cell 20. The wordline WL electrically connects to the gate electrodes 292 and 298 of the first and second pass-gate transistors PG1 and PG2 of the first SRAM cell 10 and the gate electrodes 392 and 398 of the first and second pass-gate transistors PG10 and PG20 of the second SRAM cell 20.

According to some embodiments, the fourth source diffusion region 240 by which the source region of the second pass-gate transistor PG2 of the first SRAM cell 10 is formed and the first source diffusion region 310 by which the source region of the first pass-gate transistor PG10 of the second SRAM cell 20 is formed are disposed in a diagonal direction with reference to the first direction (X axis). Such a configuration will be more apparent with reference to FIG. 6.

As shown in FIG. 6, according to some embodiments, there is a space between the fourth source diffusion region 240 of the first SRAM cell 10 and the first source diffusion region 310 of the second SRAM cell 20, when viewed in the first direction (X axis). In addition, the fourth source diffusion region 240 of the first SRAM cell 10 and the first source diffusion region 310 of the second SRAM cell 20 are not aligned to each other in the second direction (Y axis). Since each of the fourth source diffusion region 240 of the first SRAM cell 10 and the first source diffusion region 310 of the second SRAM cell 310 are discontinuously formed along the second direction (Y axis), when the fourth source diffusion region 240 of the first SRAM cell 10 and the first source diffusion region 310 of the second SRAM cell 310 are spaced apart from the intermediate region 500, a shortest distance between the fourth source diffusion region 240 of the first SRAM cell 10 and the first source diffusion region 310 of the second SRAM cell 310 becomes AC of FIG. 6.

On the other hand, when the fourth source diffusion region 240 of the first SRAM cell 10 and the first source diffusion region 310 of the second SRAM cell 20, when viewed in the first direction (X axis), the shortest distance between the fourth source diffusion region 240 of the first SRAM cell 10 and the first source diffusion region 310 of the second SRAM cell 20 is the same as AB or DC, which is a distance between boundary lines L2 and L4 in the second direction (Y axis) of the fourth source diffusion region 240 of the first SRAM cell 10 and the first source diffusion region 310 of the second SRAM cell 310.

Referring to FIG. 6, according to some embodiments, θ, an inclined angle between the shortest distance AC between the fourth source diffusion region 240 of the first SRAM cell 10 and the first source diffusion region 310 of the second SRAM cell 20 and the first direction (X axis) (or the boundary lines L1 or L3) satisfies 0°<θ≤90° to reduce the size of each SRAM cell but meets the requirement that the shortest distance between the adjacent source diffusion regions 240 and 310 be equal to or greater than a predetermined distance. According to other embodiments, the inclined angle θ satisfies 45°≤θ≤90°. In such a range, the SRAM including SRAM cells having adjacent source diffusion regions thereof diagonally arranged can more effectively reduce the size of each SRAM cell than the SRAM in which the inclined angle θ is less than 45°.

In general, the shortest distance between two adjacent diffusion regions such as two adjacent sources regions, has to be equal to or greater than a predetermined distance $D_0$. The predetermined distance $D_0$ may be determined by manufacturing processes or determined by desirable device performance, such as allowable maximum electric current leakage. In other words, two adjacent source diffusion regions cannot be too close to each other.

According to embodiments of the present disclosure, a distance between the first and second SRAM cells 10 and 20 may be reduced without scarifying the performance of the SRAM, when the fourth source diffusion region 240 of the first SRAM cell 10 and the first source diffusion region 310 of the second SRAM cell 310 are disposed in a diagonal direction with reference to the first direction (X axis) and are spaced apart from the intermediate region 500. Accordingly, more transistors or more SRAM cells may be formed in a unit area, as a distance between adjacent SRAM cells is reduced according to embodiments of the present disclosure. Therefore, comparing to an SRAM having the same chip size, in which the source diffusion regions of the pass-gate transistors are continuously formed in the second direction (Y axis), the SRAM according to embodiments of the present disclosure may have a more data storage capacity.

As shown in FIG. 6, when AC is equal to the predetermined distance $D_0$, a distance between the first and second SRAM cells 10 and 20 according to embodiments of the present disclosure becomes DC or AB which is equal to $D_0 \cdot \cos(\theta)$, less than $D_0$ when θ is greater than 0. As an example, when the inclined angle θ is 45°, a distance between the first and second SRAM cells 10 and 20 is $0.707 \cdot D_0$. Thus, for each SRAM cell formed in the same row, in the first direction (X axis), a dimension is reduced by $0.293 \cdot D_0$. A significant reduction in die area may be achieved when more SRAM cells are integrated into the SRAM.

Figure 7A:
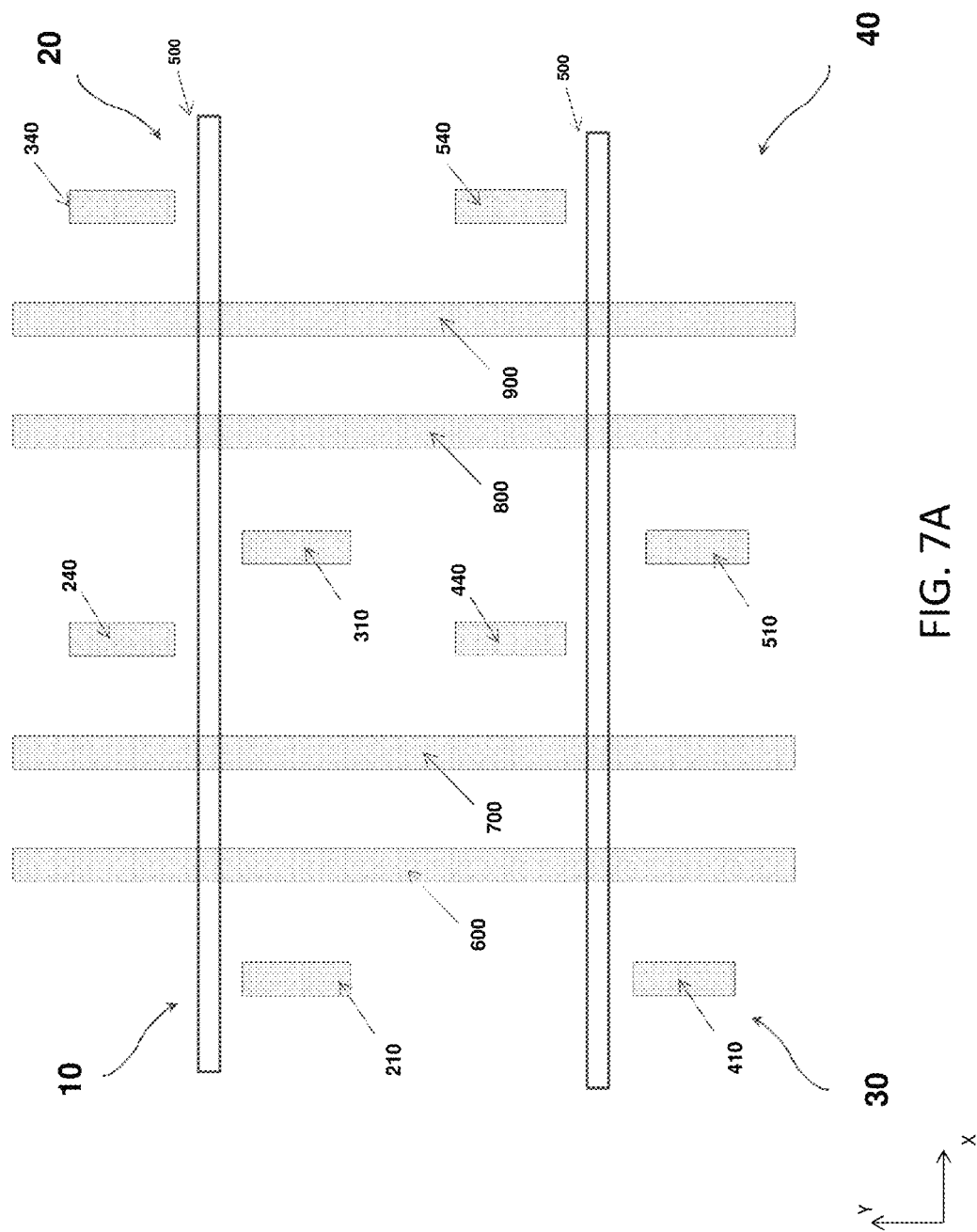
FIGS. 7A and 7B are simplified layouts of SRAM cells according to some embodiments of the present disclosure, in which only source diffusion regions of the SRAM cells are illustrated.
Figure 7B:
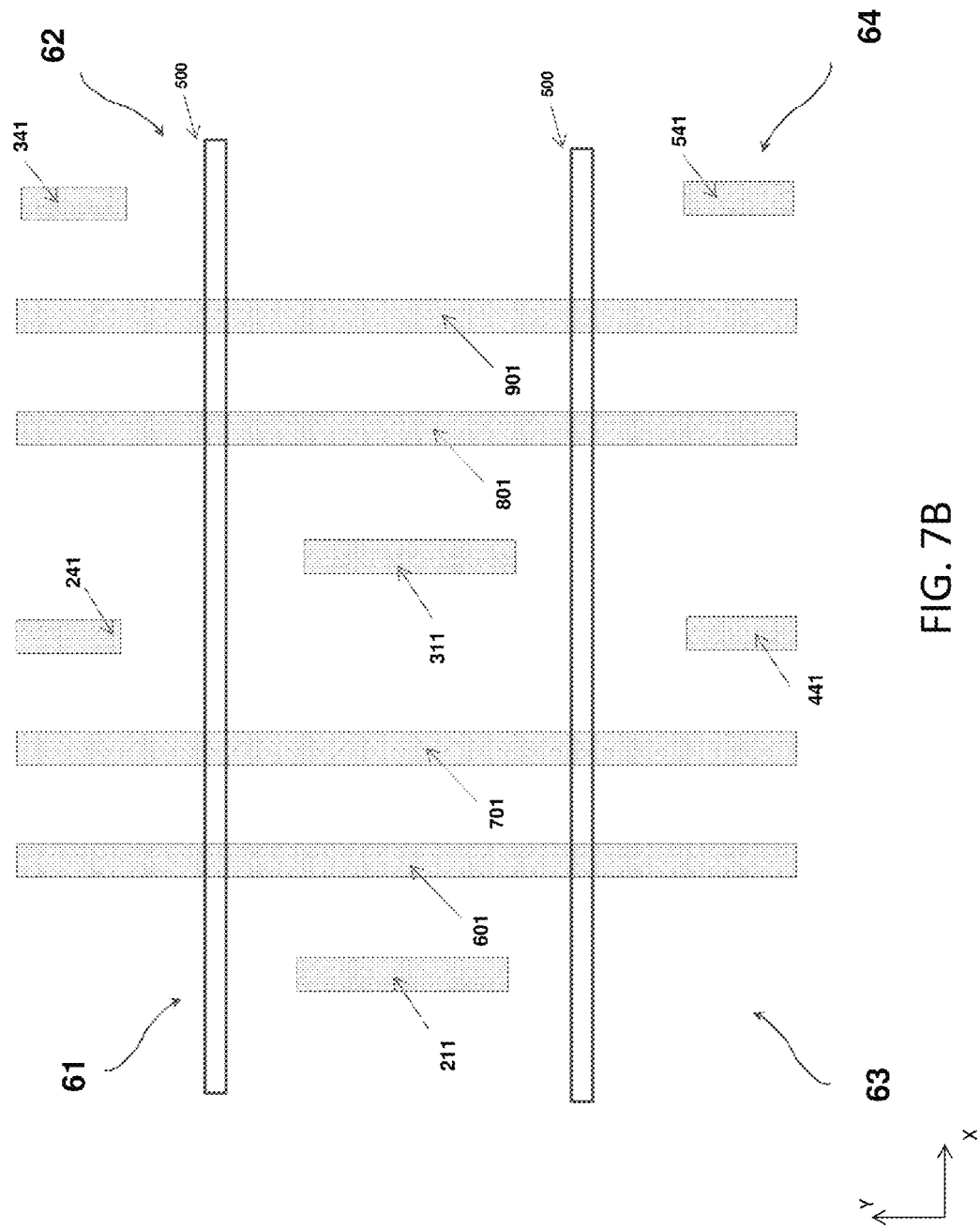

FIGS. 7A and 7B are simplified layouts of SRAM cells according to some embodiments of the present disclosure, in which only source diffusion regions of the SRAM cells are illustrated.

According to some embodiments of the present disclosure, an SRAM includes more than two SRAM cells arranged in a plurality of rows and a plurality of columns forming an array. As an example, as shown in FIG. 7A, four SRAM cells 10, 20, 30, and 40 are arranged in two adjacent rows and two adjacent columns. According to some embodiments, third and fourth SRAM cells 30 and 40 may be identical to the aforementioned first and second SRAM cells 10 and 20. Therefore, a description of features of the third and fourth SRAM cell 30 and 40 overlapping those of the first SRAM cells 10 and 20 described above will be omitted here.

Referring to FIG. 7A, the first and second SRAM cells 10 and 20 are arranged in a first direction (X axis), i.e., the row direction, and the third and fourth SRAM cells 30 and 40 are arranged in the first direction (X axis) in an adjacent row of the first and second SRAM cells 10 and 20. Accordingly, the first and third SRAM cells 10 and 30 are arranged in the same column and the second and fourth SRAM cells 20 and 40 are arranged in another same column.

Since each of second and third source diffusion regions of each SRAM cell is continuous in each cell, the second and third source diffusion regions of the first and third SRAM cells 10 and 30 become a single source diffusion region 600 and another single source diffusion region 700, respectively, each continuously extending in a region occupied by both the first and third SRAM cells 10 and 30. Similarly, the second and third source diffusion regions of the second and fourth SRAM cells 20 and 40 become a single source diffusion region 800 and another single source diffusion region 900, respectively, each continuously extending in the region occupied by the second and fourth SRAM cells 20 and 40.

It would be apparent that when three or more SRAM cells are arranged in the same column, all the second (or third) source diffusion regions of the three or more SRAM cells are directly connected to each other and continuously extend along the respective column.

On the other hand, since each of first and fourth source diffusion regions of each SRAM cell does not fully extend in the column direction (Y axis), the first source diffusion regions of the first and third SRAM cells 10 and 30 include discrete source diffusion regions 210 and 410 spaced-apart from each other, and the fourth source diffusion regions of the first and third SRAM cells 10 and 30 include discrete source diffusion regions 240 and 440 spaced-apart from each other. The discrete source diffusion regions 210 and 410 and the discrete source diffusion regions 240 and 440 offset each other in the column direction (Y axis). Similarly, the first source diffusion regions of the second and fourth SRAM cells 20 and 40 include discrete source diffusion regions 310 and 510 spaced-apart from each other, and the fourth source diffusion regions of the second and fourth SRAM cells 20 and 40 include discrete source diffusion regions 340 and 540 spaced-apart from each other. The discrete source diffusion regions 210 and 410 and the discrete source diffusion regions 240 and 440 offset each other in the column direction (Y axis). Although not shown in FIG. 7A, shallow trench isolation is formed between adjacent source diffusion regions and defines the boundaries of source diffusion regions.

It would be apparent that when three or more SRAM cells are arranged in the same column, all the first (or fourth) source diffusion regions of the three or more SRAM cells are discontinuously formed and are spaced-apart from each other in the column direction.

FIG. 7B shows another example, in which first through fourth SRAM cells 61, 62, 63, and 64 are arranged in two adjacent rows and two adjacent columns. According to some embodiments, the third and fourth SRAM cells 63 and 64 are horizontally flipped with reference to the first and second SRAM cells 61 and 62. Thus, first source diffusion region of the first SRAM cell 61 and first source diffusion region of the third SRAM cell 63 are combined to each other to become a source diffusion region 211, and first source diffusion region of the second SRAM cell 62 and first source diffusion region of the fourth SRAM cell 64 are combined to each other to become a source diffusion region 311. On the other hand, fourth source diffusion region 241 of the first SRAM cell 61 and the source diffusion region 311 of the second and fourth SRAM cells 62 and 64 are diagonally arranged and are spaced apart from the intermediate region 500, and fourth source diffusion region 441 of the third SRAM cell 63 and the source diffusion region 311 of the second and fourth SRAM cells 62 and 64 are diagonally arranged and are spaced apart from the intermediate region 500. Although not shown in FIG. 7B, shallow trench isolation is formed between adjacent source diffusion regions and defines the boundaries of source diffusion regions.

Since each of second and third source diffusion regions of each SRAM cell is continuous in each cell, the second and third source diffusion regions of the first and third SRAM cells 61 and 63 become a single source diffusion region 601 and another single source diffusion region 701, respectively, each continuously extending in a region occupied by both the first and third SRAM cells 61 and 63. Similarly, the second and third source diffusion regions of the second and fourth SRAM cells 62 and 64 become a single source diffusion region 801 and another single source diffusion region 901, respectively, each continuously extending in the region occupied by the second and fourth SRAM cells 62 and 64.

FIGS. 8A and 8B are simplified layouts of SRAM cells according to other embodiments of the present disclosure, based on modification of the layout of the SRAM cells illustrated in FIG. 6. A description of features overlapping those of the aforementioned layout will be omitted in order to avoid redundancy.

Referring to FIG. 8A, a boundary line L2 of a fourth source diffusion region 240 by which a source region of a second pass-gate transistor PG2 of a first SRAM cell is formed, and a boundary line L4 of a first source diffusion region 310 by which a source region of a first pass-gate transistor PG10 of a second SRAM cell is formed, are aligned to each other in a second direction (Y axis). In this case, the fourth source diffusion region 240 of the first SRAM cell and the first source diffusion region 310 of the second SRAM cell are spaced apart from the intermediate region 500, since the fourth source diffusion region 240 of the first SRAM cell and the first source diffusion region 310 of the second SRAM cell are spaced-apart from each other by a distance, for example, by the predetermined distance $D_0$, in the second direction (Y axis).

Referring to FIG. 8B, a fourth source diffusion region 240 by which a source region of a second pass-gate transistor PG2 of a first SRAM cell is formed, and a first source diffusion region 310 by which a source region of a first pass-gate transistor PG10 of a second SRAM cell is formed, are aligned to each in a second direction (Y axis). In other words, in each SRAM cell, a source diffusion region in which a pass-gate transistor is formed is discontinuously formed in the second direction (Y axis).

Although not illustrated in FIGS. 8A and 8B, it should be appreciated that layouts of other layers, such as local connection lines and metal wirings, may be modified correspondingly to avoid short-circuit between adjacent SRAM cells with reference to the layout of the SRAM illustrated in FIG. 3.

FIG. 9 shows a flowchart of a method for manufacturing an SRAM array according to an embodiment of the present disclosure. It is understood that additional steps can be provided before, during, and after various steps illustrated by FIG. 9, and some of the steps described below can be replaced or eliminated. The order of the operations/steps may be interchangeable.

In S910, source diffusion regions, having the foregoing layout, configuration and structures, together with correspondingly silicide layers are formed the source diffusion regions. In S920, various layers, such as channel layers, gate electrode layers, and gate insulating layers, of transistors, having the foregoing layout, configuration and structures, are formed over the substrate. In S930, drain regions (top plates) having the foregoing layout, configuration and structures are formed over the various layers of the transistors. In S940, contacts, such as contact bars, gate contacts, local connects, and plate contacts, are formed. In S950, the first vias in the first vial level and first level metal wirings in the first metal layer level are formed. In S960, the second vias in the second via level and second level metal wirings in the second metal layer level are formed. The first and second metal layers form the wordlines, bitlines, and power supply lines.

According to some aspects of the present disclosure, a static random access memory (SRAM) cell includes first through fourth source diffusion regions sequentially arranged in a first direction, a first pass-gate transistor, a source region of which is formed by the first source diffusion region, first and second pull-up transistors, source regions of which are formed by the second source diffusion region, first and second pull-down transistors, source regions of which are formed by the third source diffusion region, a second pass-gate transistor, a source region of which is formed by the fourth source diffusion region, and an intermediate region between the first and second pass-gate transistors linearly extending along a direction parallel to the first direction and across the entire SRAM cell. Each of the first source diffusion region and the fourth source diffusion region is spaced-apart from the intermediate region.

According to some aspects of the present disclosure, a static random access memory (SRAM) includes first and second SRAM cells disposed adjacent to each other in a first direction. Each of the first and second SRAM cells includes first and second pass-gate transistors disposed at opposite sides of the respective SRAM cell in the first direction and a plurality of data storage transistors formed in a region between the first and second pass-gate transistors thereof. The second pass-gate transistor of the first SRAM cell and the first pass-gate transistor of the second SRAM cell are disposed between the region forming the plurality of data storage transistors of the first SRAM cell and the region forming the plurality of data storage transistors of the second SRAM cell. Each of a source diffusion region, by which a source region of the second pass-gate transistor of the first SRAM cell is formed, and a source diffusion region, by which a source region of the first pass-gate transistor of the second SRAM cell is formed, is spaced-apart from an intermediate region of the first and second SRAM cells. The intermediate region between the first and second pass-gate transistors linearly extends along a direction parallel to the first direction and across the entire first and second SRAM cells.

According to some aspects of the present disclosure, a static random access memory (SRAM) includes first and second SRAM cells disposed adjacent to each other in a column direction. Each of the first and second SRAM cells includes first and second pass-gate transistors disposed at opposite sides of the respective SRAM cell in a row direction perpendicular to the column direction and a plurality of data storage transistors disposed between the opposite sides. Source regions of the first pass-gate transistors of the first and second SRAM cells are formed by different source diffusion regions spaced-apart from each other by an insulation region, or source regions of the second pass-gate transistors of the first and second SRAM cells are formed by different source diffusion regions spaced-apart from each other by another insulation region. The source diffusion regions, by which the source regions of the second pass-gate transistors of the first and second SRAM cells are formed, are located at the same side of the plurality of data storage transistors of the first and second SRAM cells.

According to some aspects of the present disclosure, a distance between adjacent SRAM cells disposed in the same row may be reduced, when discontinuously formed source diffusion regions of adjacent SRAM cells are disposed in a diagonal direction with reference to the row direction and do not overlap with each other in the row direction. Accordingly, more transistors or SRAM cells may be formed in a unit area, as a distance between adjacent SRAM cells is reduced. Therefore, the SRAM according to embodiments of the present disclosure may have more data storage capacity.

According to some aspects of the present disclosure, bitlines and power supply nodes of an SRAM may be formed of a metal layer over source diffusion regions of the SRAM and connected to the source diffusion regions. Thus, a ratio of signal-to-noise and an efficiency of power usage may be improved, as signals transmitted to and from or power applied to SRAM cells in the same column through a metal layer having relatively lower resistance comparing to source diffusion regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell, comprising:
   first through fourth source diffusion regions sequentially arranged in a first direction and being spaced-apart from each other in the first direction, each source diffusion region extending in a second direction perpendicular to the first direction;
   a first pass-gate transistor, a source region of which is formed by the first source diffusion region;
   first and second pull-up transistors, source regions of which are formed by the second source diffusion region;
   first and second pull-down transistors, source regions of which are formed by the third source diffusion region; and a second pass-gate transistor, a source region of which is formed by the fourth source diffusion region, wherein in the SRAM cell, the first source diffusion region and the fourth source diffusion region do not overlap with each other in the first direction or in the second direction.

2. The SRAM cell of claim 1, wherein:

channels of the first pass-gate transistor, the first pull-up transistor, and the first pull-down transistor are disposed in a first path parallel to the first direction, channels of the second pull-up transistor, the second pull-down transistor, and the second pass-gate transistor are disposed in a second path parallel to the first direction, the second and third source diffusion regions extend continuously between the first and second paths, and each of the first and fourth source diffusion regions is spaced-apart from one of the first and second paths.

3. The SRAM cell of claim 1, wherein:

drain regions of the first pass-gate transistor, the first pull-up transistor, and the first pull-down transistor are electrically connected to each other through a first drain diffusion region extending along the first direction, and drain regions of the second pull-up transistor, the second pull-down transistor, and the second pass-gate transistor are electrically connected to each other through a second drain diffusion region extending along the first direction.

4. The SRAM cell of claim 1, wherein each transistor has a source region, a channel, and a drain region vertically stacked on a surface of a substrate.

5. The SRAM cell of claim 2, wherein:

the first source diffusion region covers a region around the first path and is spaced-apart from the second path, and the fourth source diffusion region covers a region around the second path and is spaced-apart from the first path.

6. The SRAM cell of claim 3, wherein:

gate electrodes of the first pull-up transistor and the first pull-down transistor are electrically connected to each other through a first gate line extending along the first direction, gate electrodes of the second pull-up transistor and the second pull-down transistor are electrically connected to each other through a second gate line extending along the first direction, the first drain diffusion region and the second gate line are electrically connected to each other through a first data storage electrode, and the second drain diffusion region and the first gate line are electrically connected to each other through a second data storage electrode.

7. The SRAM cell of claim 6, wherein:

gate electrodes of the first and second pass-gate transistors are electrically connected to a wordline extending along the first direction, the first source diffusion region by which the source region of the first pass-gate transistor is formed is electrically connected to a first bitline extending along the second direction, the second source diffusion region by which the source regions of the first and second pull-up transistors are formed is electrically connected to a first power supply node extending along the second direction, the third source diffusion region by which the source regions of the first and second pull-down transistors are formed is electrically connected to a second power supply node extending along the second direction, and the fourth source diffusion region by which the source region of the second pass-gate transistor is formed is electrically connected to a second bitline extending along the second direction.

8. The SRAM cell of claim 7, wherein each of the first and second bitlines and the first and second power supply nodes is formed of a metal.

9. A static random access memory (SRAM), comprising first and second SRAM cells disposed adjacent to each other in a first direction, wherein each of the first and second SRAM cells comprises:

first and second pass-gate transistors disposed at opposite sides of the respective SRAM cell in the first direction; and a plurality of data storage transistors formed in a region between the first and second pass-gate transistors of the respective SRAM cell, the second pass-gate transistor of the first SRAM cell and the first pass-gate transistor of the second SRAM cell are disposed between the region forming the plurality of data storage transistors of the first SRAM cell and the region forming the plurality of data storage transistors of the second SRAM cell, a source diffusion region, by which a source region of the second pass-gate transistor of the first SRAM cell is formed and which extends in a second direction perpendicular to the first direction, and a source diffusion region, by which a source region of the first pass-gate transistor of the second SRAM cell is formed and which extends in the second direction, do not overlap with each other in the first direction or in the second direction, and all of the source diffusion regions in each of the first and second SRAM cells are spaced-apart from each other in the first direction.

10. The SRAM of claim 9, wherein the source diffusion region by which the source region of the second pass-gate transistor of the first SRAM cell is formed and the source diffusion region by which the source region of the first pass-gate transistor of the second SRAM cell is formed are disposed in a diagonal direction with reference to the first direction.

11. The SRAM of claim 9, wherein the source diffusion region by which the source region of the second pass-gate transistor of the first SRAM cell is formed and the source diffusion region by which the source region of the first pass-gate transistor of the second SRAM cell is formed are spaced-apart and aligned to each other in the second direction.

12. The SRAM of claim 9, further comprising a wordline electrically connecting to gate electrodes of the first and second pass-gate transistors of the first and second SRAM cells.

13. The SRAM of claim 9, wherein in each of the first and second SRAM cell:

drain regions of the first pass-gate transistor, the first pull-up transistor, and the first pull-down transistor are electrically connected to each other through a first drain diffusion region of the respective SRAM cell extending along the first direction, and drain regions of the second pull-up transistor, the second pull-down transistor, and the second pass-gate transistor are electrically connected to each other through a second drain diffusion region of the respective SRAM cell extending along the first direction.

14. The SRAM of claim 13, wherein in each of the first and second SRAM cell:
gate electrodes of the first pull-up transistor and the first pull-down transistor are electrically connected to each other through a first gate line of the respective SRAM cell extending along the first direction,
gate electrodes of the second pull-up transistor and the second pull-down transistor are electrically connected to each other through a second gate line of the respective SRAM cell extending along the first direction,
the first drain diffusion region and the second gate line of the respective SRAM cell are electrically connected to each other through a first data storage electrode of the respective SRAM cell, and
the second drain diffusion region and the first gate line of the respective SRAM cell are electrically connected to each other through a second data storage electrode of the respective SRAM cell.

15. The SRAM of claim 9, wherein each transistor has a source region, a channel, and a drain region vertically stacked on a surface of a substrate.

16. The SRAM of claim 14, wherein:
a source region of the first pass-gate electrode of the first SRAM cell is electrically connected to a first bitline extending along the second direction perpendicular to the first direction,
source regions of the first and second pull-up transistors of the first SRAM cell are electrically connected to a first power supply node extending along the second direction,
source regions of the first and second pull-down transistors of the first SRAM cell are electrically connected to a second power supply node extending along the second direction,
a source region of the second pass-gate electrode of the first SRAM cell is electrically connected to a second bitline extending along the second direction,
a source region of the first pass-gate electrode of the second SRAM cell is electrically connected to a third bitline extending along the second direction,
source regions of the first and second pull-up transistors of the second SRAM cell are electrically connected to a third power supply node extending along the second direction,
source regions of the first and second pull-down transistors of the second SRAM cell are electrically connected to a fourth power supply node extending along the second direction, and
a source region of the second pass-gate electrode of the second SRAM cell is electrically connected to a fourth bitline extending along the second direction.

17. The SRAM of claim 16, wherein each of the first through fourth bitlines and the first through power supply nodes is formed of a metal.

18. A static random access memory (SRAM), comprising first and second SRAM cells disposed adjacent to each other in a column direction,
wherein each of the first and second SRAM cells comprises:
first and second pass-gate transistors disposed at opposite sides of the respective SRAM cell in a row direction perpendicular to the column direction; and
a plurality of data storage transistors disposed between the opposite sides of the respective SRAM cell,
source regions of the first pass-gate transistors of the first and second SRAM cells are formed by different source diffusion regions spaced-apart from each other by an insulation region, or source regions of the second pass-gate transistors of the first and second SRAM cells are formed by different source diffusion regions spaced-apart from each other by an insulation region, and
the source diffusion regions, by which the source regions of the second pass-gate transistors of the first and second SRAM cells are formed, are located at the same side of the plurality of data storage transistors of the first and second SRAM cells.

19. The SRAM of claim 18, wherein source regions of the plurality of data storage transistors are formed by two parallel source diffusion regions each extending continuously in the column direction.

20. The SRAM cell of claim 18, wherein each transistor has a source region, a channel, and a drain region vertically stacked on a surface of a substrate.

* * * * *